United States Patent [19]

Walczak et al.

[11] Patent Number: 4,802,236
[45] Date of Patent: Jan. 31, 1989

[54] INSTANTANEOUS DEVIATION LIMITER WITH PRE-EMPHASIS AND ZERO AVERAGE VALUE

[75] Inventors: Thomas J. Walczak, Fox River Grove; Michael E. Rebeschini, Hanover Park; Melvin A. Schechtman, Schaumburg, all of Ill.

[73] Assignee: Motorola, Inc., Schaumburg, Ill.

[21] Appl. No.: 947,783

[22] Filed: Dec. 30, 1986

[51] Int. Cl.⁴ .............................................. H04B 1/02
[52] U.S. Cl. ................................... 455/110; 455/116; 455/126
[58] Field of Search ............... 455/91, 110, 116, 126; 332/18, 38, 192; 381/108, 120, 121, 107

[56] References Cited

U.S. PATENT DOCUMENTS

| | | | |
|---|---|---|---|
| 3,061,793 | 10/1962 | Verkruissen | 330/27 |
| 3,396,340 | 8/1968 | Black et al. | 325/138 |
| 3,529,244 | 9/1970 | Torick | 455/110 |
| 3,564,437 | 2/1971 | Nakashima | 307/237 |
| 3,579,123 | 5/1971 | Koga | 330/164 |
| 3,651,429 | 3/1972 | Ruthroff | 332/18 |
| 3,688,205 | 8/1972 | Burger | 329/132 |
| 3,810,018 | 5/1974 | Stover | 325/30 |
| 3,846,710 | 11/1974 | Chapman | 330/11 |
| 3,879,672 | 4/1975 | Milanes | 330/29 |
| 4,268,760 | 5/1981 | Tokunaga et al. | 307/562 |
| 4,379,272 | 4/1983 | Wheatley | 455/116 |
| 4,466,119 | 8/1984 | Peters | 381/108 |
| 4,476,498 | 10/1984 | Sheean | 358/330 |
| 4,491,972 | 1/1985 | Weber | 455/110 |
| 4,506,381 | 3/1985 | Ono | 381/94 |
| 4,550,426 | 10/1985 | Gillig et al. | 381/46 |
| 4,578,818 | 3/1986 | Claydon | 455/110 |

Primary Examiner—Michael A. Masinick
Attorney, Agent, or Firm—Melvin A. Schechtman

[57] ABSTRACT

A modulation limiter that eliminates over-deviation otherwise caused by asymmetrical modulation signals in a frequency modulated (FM) transmitter. The output signal from a conventional modulation clipper is integrated, multiplied by a gain constant, and subtracted from the input, which causes the clipper output to have zero average and a high-pass frequency response with a time constant determined by the feedback gain. The zero average value allows the clipped modulation signal to be coupled to a modulator without over-deviation caused by shifts in the average value of the clipped signal, and the high-pass response can be used to give the modulation signal pre-emphasis.

14 Claims, 5 Drawing Sheets

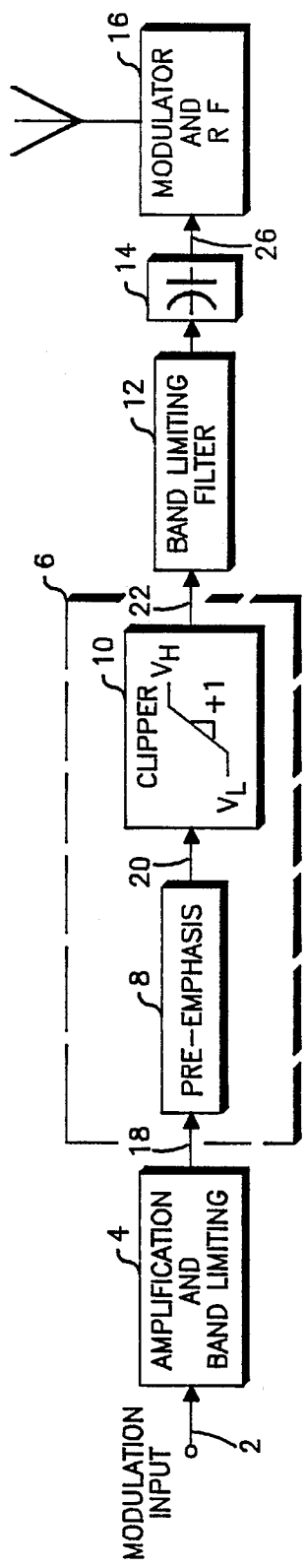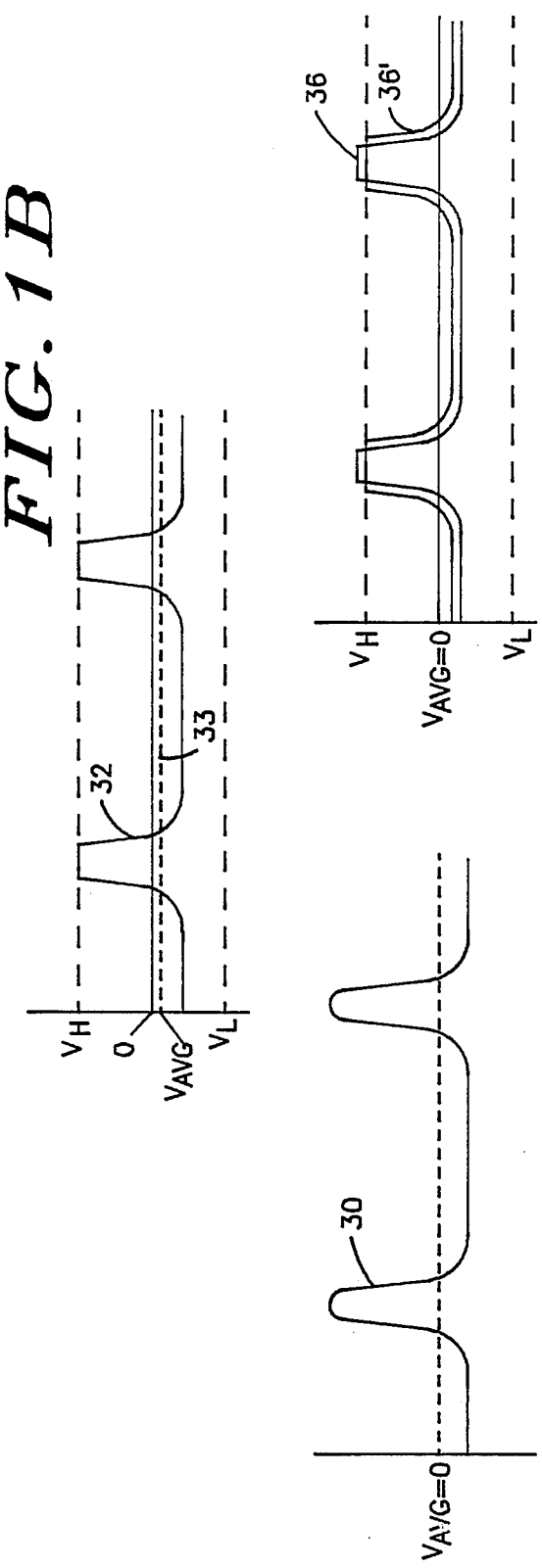

$$H(S) = \frac{S}{S+K_1}$$

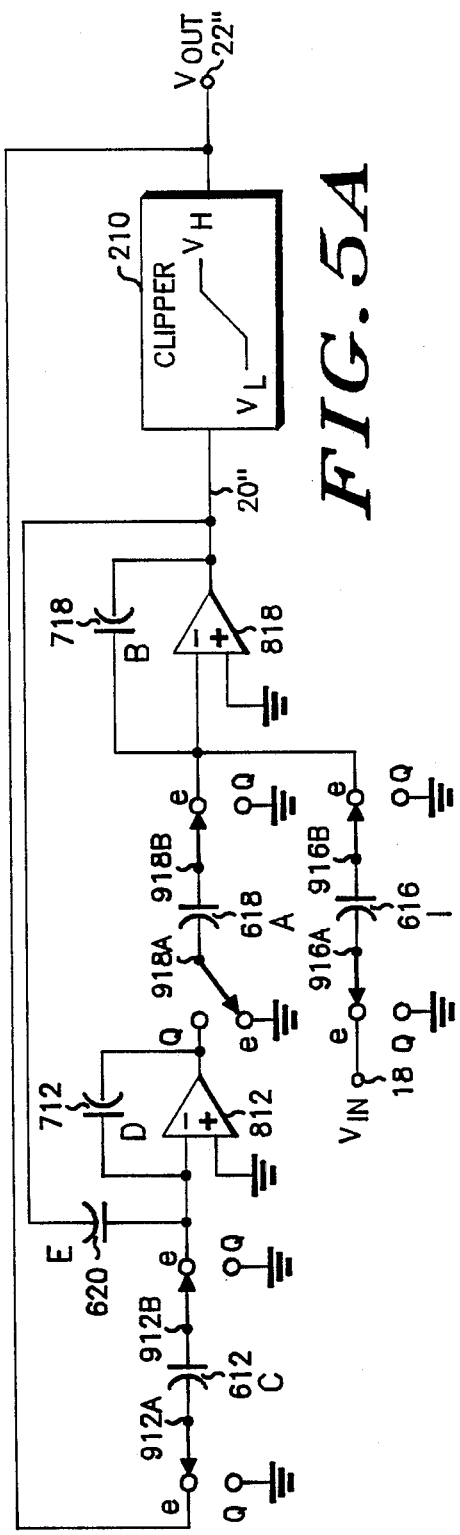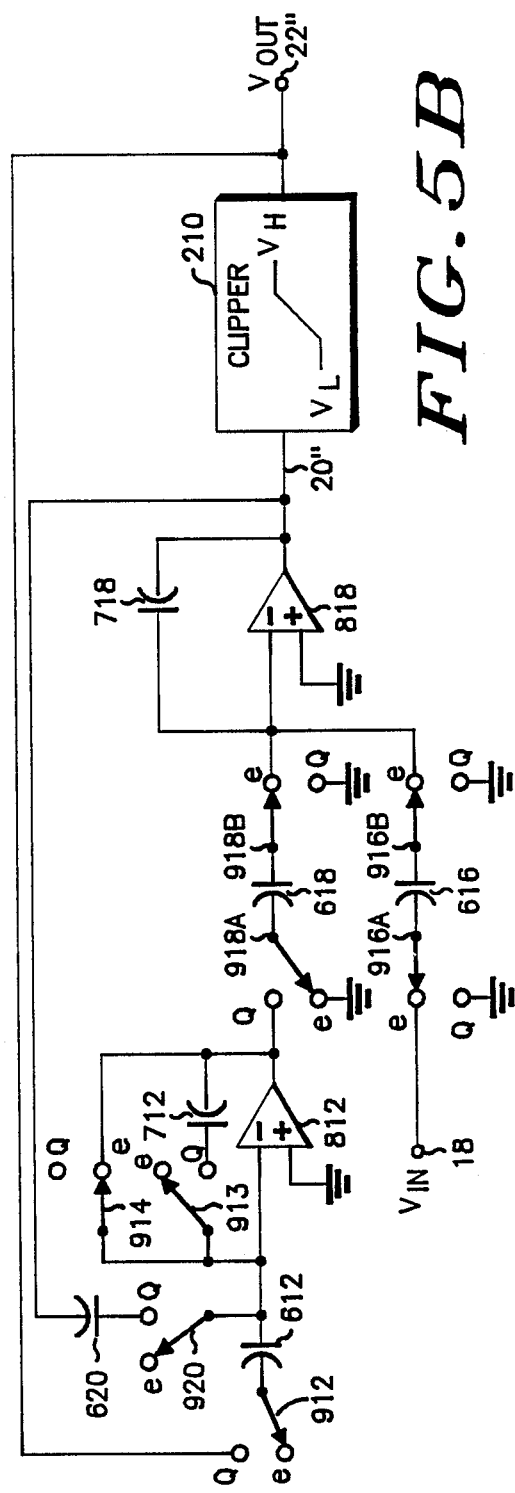

INSTANTANEOUS DEVIATION LIMITER WITH PRE-EMPHASIS AND ZERO AVERAGE VALUE

BACKGROUND OF THE INVENTION

1. Technical Field of the Invention

This invention pertains to clipping circuits and, in particular, to audio clipping circuits used to limit instantaneous deviation of the carrier in a frequency modulated (FM) radio transmitter.

2. Description of the Prior Art

In an FM system, the occupied spectrum of the transmitted signal depends on the peak deviation of the carrier and the frequency content of the modulating signal. In voice applications, modulation levels can vary widely, and signal peaks often greatly exceed average modulation levels. For efficient communication, it is desirable to modulate at a high level; however, to conserve radio spectrum, it is desirable to limit peak deviation.

To avoid over-deviating the carrier while modulating at high average level with varying voice signals, FM transmitters often use clippers to limit voice modulation peaks. FM systems also pre-emphasize the modulation signals, both to allow for de-emphasis in FM receivers, which shapes the detected noise and improves recovered signal to noise ratio, and to compensate for thenatural high frequency roll-off of voice signals. Pre-emphasis before clipping allows more efficient communication by raising the level of the high frequency voice components and providing more total modulation energy for a given peak deviation.

FIG. 1a shows a block diagram of an FM radio transmitter that incorporates pre-emphasis and clipping as part of its modulation section. Voice signals enter port 2, receive amplification and bandlimiting in circuit 4, and go to an instantaneous deviation control (IDC) circuit 6, which provides pre-emphasis (8) and audio clipping (10). A bandlimiting filter (12) removes high frequency components caused by clipping; then the modulation signal capacitively couples (14) to the modulator and RF stages (16).

In practice, FM transmitters generally do not extend modulation response down to zero frequency (DC). This makes control of the carrier frequency easier, because a non-zero DC level in the modulation path does not affect the modulator. A non-zero DC level may arise from circuit offsets or from clipping of asymmetrical modulation signals. The waveforms in FIG. 1b, which depict signals at various points before and after the clipper of FIG. 1a, illustrate how this happens.

Waveform 30, which refers to signal 20 at the input to the clipper, can be asymmetrical for a number of reasons. For example, the stages preceding the IDC network 6 may have unequal dynamic ranges for positive and negative excursions from their operating points and may produce asymmetrical waveforms when overdriven. Except for unavoidable DC offsets, signal 20 would have zero average value, because pre-emphasis gives it a high-pass characteristic and removes its DC component. As shown by waveform 32, which refers to signal 22 at the output of the clipper, the clipper passes the portion of the signal within the clipping levels indicated as $V_h$ and $V_l$. The input signal has zero average; however, because the clipper removes part of the positive peak, the output signal averages to negative $V_{avg}$ (33).

After bandlimiting in filter 12, the clipped signal couples to the modulator and appears at point 26. The modulator does not respond to DC; therefore, it responds to deviations about the average value of the signal. Waveform 36 shows the signal shifted positively by the amount $V_{avg}$ (33), so that it centers about its average, as the modulator would respond to it. The positive peak swings too far when measured relative to the average. This signal would cause the carrier to over-deviate in the direction corresponding to positive modulation.

To prevent over-deviation, the signal at point 22 should be clipped so that its peaks stay between $V_h$ and $V_l$, measured relative to the average of the clipped signal rather than relative to zero. Clipping can change the average value of the signal, and the excursion from the average to one peak will be too large. If the signal were to be clipped and still have zero average, the problem would be eliminated. Waveform 36' shows an example of this. The signal has been altered so that it averages to zero yet stays within the clipping limits.

Some prior art circuit designs accomplish limiting by the use of high-gain, AC coupled, feedback amplifiers that saturate at predictable voltage limits. For example, see U.S. Pat. No. 4,491,972, issued Jan. 1, 1985, to Weber and assigned to the same assignee as this application. These limiters may incidentally achieve zero average output voltage in the steady state by using long time-constant coupling circuits, but they respond slowly to changes and allow transient overdeviation. Furthermore, to achieve miniaturization, it is frequently desirable to implement these limiters in monolithic switched capacitor form, but the long time-constants require large capacitor ratios, which are difficult and uneconomical to achieve.

SUMMARY OF THE INVENTION

In view of the deficiencies in the prior art described above, an object of this invention is to provide an audio clipper that can maintain zero average value in a signal being clipped at predetermined positive and negative excursions. Another object is to filter the signal with a high-pass time constant that can be used to provide pre-emphasis. A further object is to facilitate implementation of switched capacitor and other monolithic versions of the improved limiter by avoiding the need for long time constants or large capacitor ratios.

A preferred embodiment of the present invention is a circuit with negative feedback that modifies an input signal as it passes through a conventional clipper. The output of the clipper is integrated, multiplied by a gain constant, and subtracted from the input signal. The feedback causes the clipped output signal to have zero average and a high-pass frequency response with a time constant determined by the feedback gain.

BRIEF DESCRIPTION OF THE DRAWINGS

The invention may be better understood by reference to the Drawings, in which:

FIGS. 1a and 1b show a block diagram of a radio transmitter in which the invention may find application and shows waveforms at selected points in the block diagram;

FIGS. 5a and 5b shows circuit diagrams of switched-capacitor versions of a clipper constructed according to the invention using both conventional and offset-cancelling design techniques.

DESCRIPTION OF THE PREFERRED EMBODIMENT

Figure 2A:
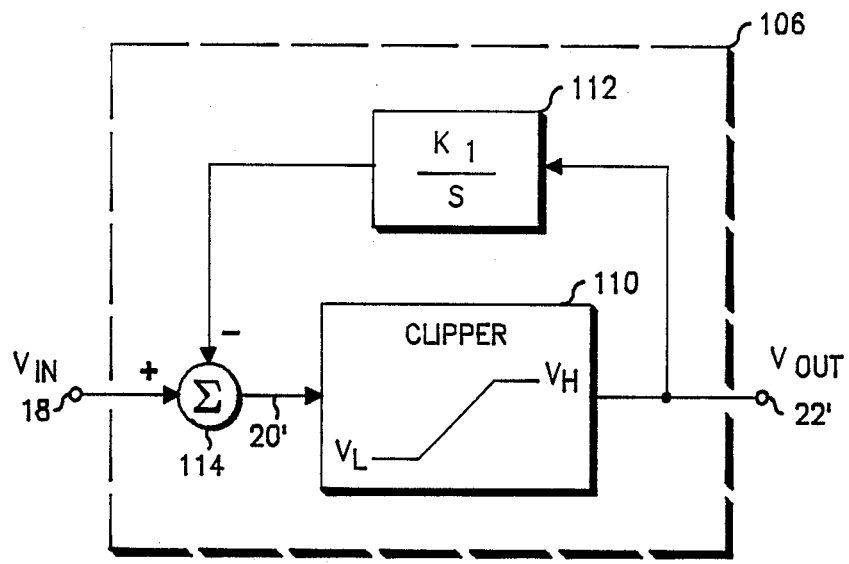
FIGS. 2a and 2b show a block diagram and transfer function of the improved clipper of this invention.

As described above in an FM system that does not respond to DC, over-deviation may be avoided by clipping the modulation signal so that it maintains zero average. FIG. 2a shows a block diagram 106 of an improved clipper, constructed in accordance with the invention, that will accomplish this. The improved clipper comprises a conventional clipper 110, an integrator 112, and summing junction 114. The output 22' of the conventional clipper is integrated and subtracted from the input signal 20'. In the steady state, the input to the integrator averages to zero; otherwise, the integrator would continue to accumulate upwards or downwards, depending on the sign of the average. The integrator produces an average output voltage sufficient to bias the clipper so that clipped signal 22' has zero average value.

Figure 2B:
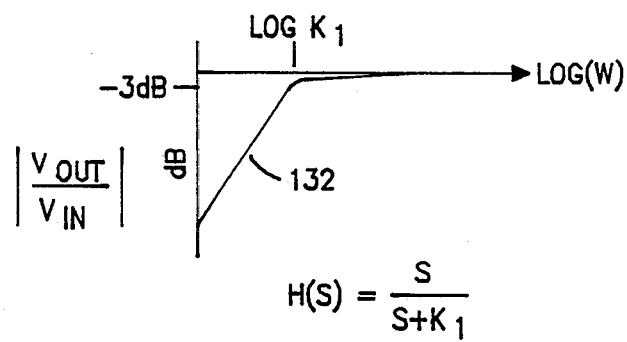

A property of the circuit is to give the modulation signal a high-pass response with a time cpnstant related to the gain of the integrator. In principle, the circuit may be used with any filter that has a transmission zero at DC, but it may be used to advantag to accomplish the pre-emphasis function desired in an FM transmitter. FIG. 2b shows the frequency response (132) and transfer function (134) of the overall IDC circuit 106. The transfer function has a high-pass time constant of 1/K1, which can be selected to pre-emphasize the entire audio modulation band. Audio pre-emphasis time-constants are generally short: for example, for a 300 to 3000 Hz modulation band, the radian frequency for the high-pass corner would be greater than 2Pi(3000) radians, which would give a time-constant on the order of 50 microseconds. Using this short a time-constant allows the clipper to rapidly respond to the input signal and to prevent transient over-deviation.

Figure 3A:
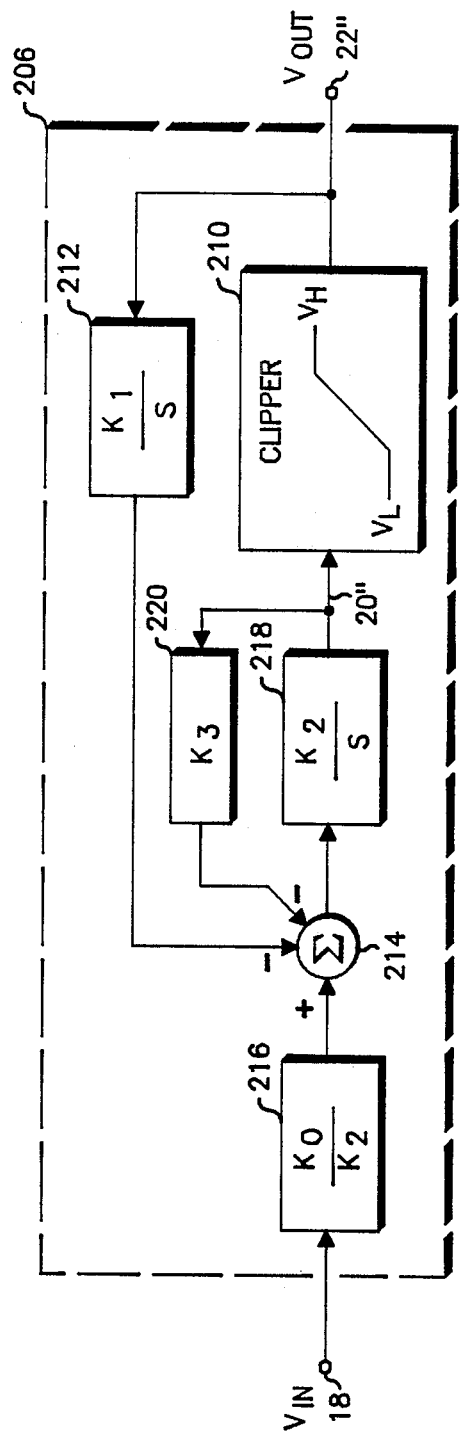
FIGS. 3a, 3b, and 3c show a block diagram, transfer function, and signal flow graph of an alternative version of clipper that includes high frequency filtering.

FIG. 3a shows an improved clipper 206, which is a version that includes a local feedback loop to produce a low-pass pole in the forward path to node 20". As before, the circuit comprises a conventional clipper (210) with integrator feedback (212) to a summing junction (214), and the low-pass loop comprises integrator 218 and feedback path 220. Block 216 scales the input signal by coefficient K0/K2 and allows the circuit to accommodate different input signal levels.

The low-pass pole provides great flexibility in the filter function in which the clipper is imbedded. FIG. 3b shows the transfer function and frequency response for a particularly convenient choice. The overall transfer function exhibits pre-emphasis for the lower frequency portion (232) of the modulation signal spectrum and low-pass filtering for the higher frequency portion 233. This response can pre-emphasize the modulation band and filter out noise above the modulation band.

Figure 3C:
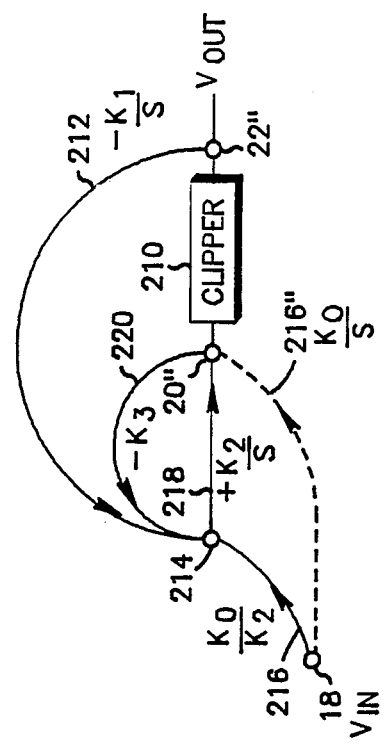
Figure 3B:
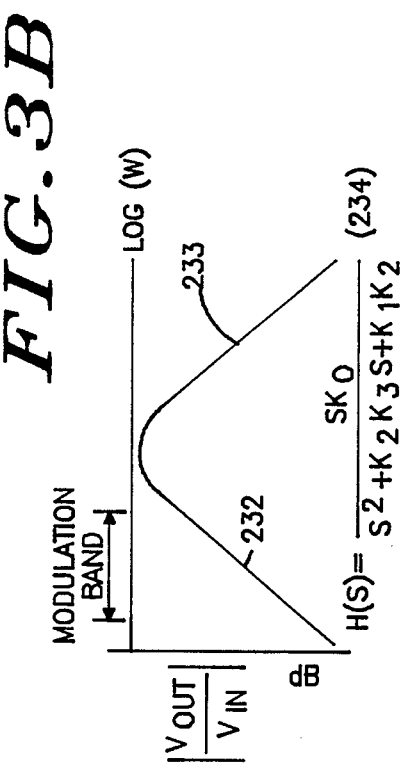

Before considering a circuit diagram of the improved clipper, it is helpful to study FIG. 3c, which is a signal flow-graph for the block diagram of FIG. 3a. The flow-graph shows that the input signal 18 can be applied directly to the integrator summing node 214 through path 216, or the input can be separately integrated in path 216' and applied to the output of the low-pass filter loop at node 20". The preferred embodiment of the circuit uses the alternative input path 216' for improved dynamic range, which will now be explained in conjunction with FIG. 4a.

Figure 4A:
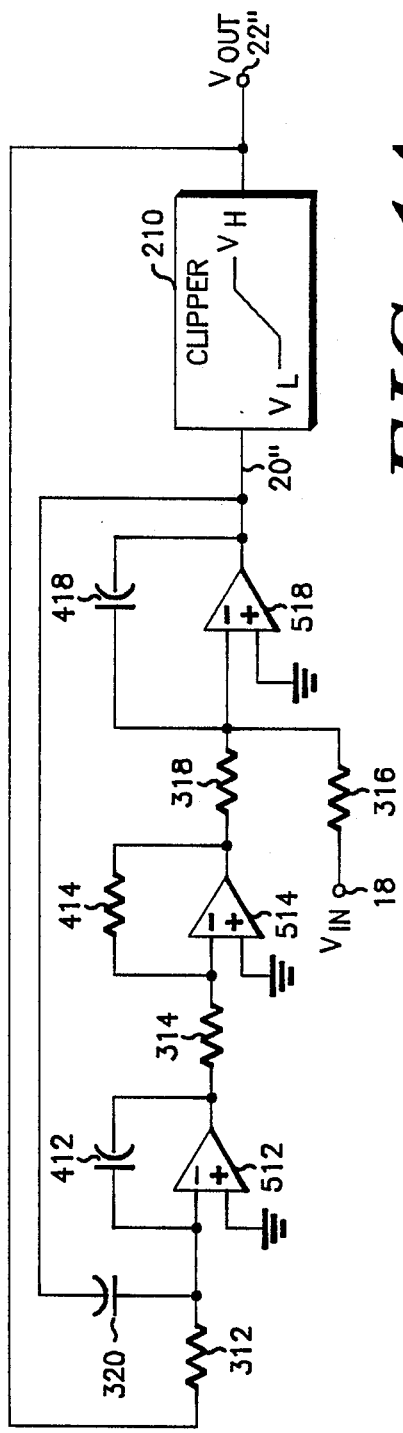
FIGS. 4a and 4b show a circuit diagram of an active RC realization of a clipper constructed according to the invention and shows detail of a conventional clipper that can be used as part of the improved clipper.

FIG. 4a shows a preferred embodiment of the invention, which is an active RC circuit using operational amplifiers. The circuit comprises amplifiers 512 and 518, with appropriate feedback components and inverting stage 314-414-514 to create a biquadratic response, and conventional clipper 210. The gain, integration, and feedback constants are determined according to well known principles for the design of active RC filters. Starting with a transfer function appropriate for the modulation band of interest, the component values can be selected according to the following relationships:

$K_0 = 1/(R_{316}C_{418})$, $K_1 = 1/(R_{312}C_{412})$, $K_2 = 1/(R_{318}C_{418})$, and $K_3 = (C_{320}/C_{412})$.

Resistors 314 and 414 can be equal to make amplifier 514 a unity-gain inverter.

Figure 4B:
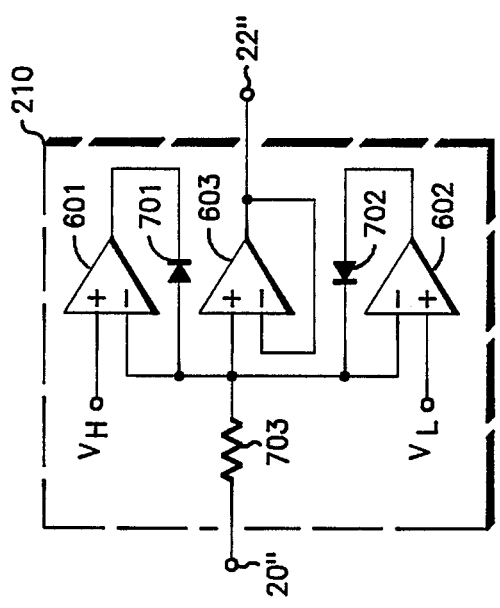

FIG. 4b shows details of a non-linear circuit that simulates an ideal diode clipper and that could be used for the conventional clipper 210. Amplifier 601 and feedback diode 701 act as an ideal diode from the output side of resistor 703 to upper clipping voltage $V_h$. Because of its high gain, amplifier 601 attempts to maintain its inverting input at the potential $V_h$ applied to its non-inverting input. If signal 20" exceeds $V_h$, amplifier 601 drives low and pulls current through diode 701 to keep the output of resistor 703 at $V_h$. Resistor 703 is selected according to the current handling capabilities of the amplifiers and diodes. Amplifier 603 buffers resistor 703 and provides drive for external circuits connected to output 22". For input signals at 20" that are below $V_h$, amplifier 601 cannot provide feedback through diode 701, so it leaves signals below the upper clipping voltage unaffected. In like manner, amplifier 602 and diode 702 function as an ideal diode connected to lower clipping voltage $V_l$ and prevent signals below $V_l$ from passing to the output 22".

If the output of amplifier 518 goes beyond the clip levels, clipper 210 will limit the output at 22". Resistor 312, which provides DC feedback to integrator 512, couples from the output side of the limiter, rather than from the output of the second amplifier, as it would be in a conventional biquad circuit. This path can provide a steady state current into the summing junction of integrator 512. Since there is no other DC path into the summing junction, the current from resistor 312 into the summing junction averages to zero in the steady state. As long as the summing junction stays at analog ground, which is the potential at the non-inverting input, the average current equals the average of output voltage $V_{out}$ 22" minus analog ground potential divided by the resistance of 312. For the current to have zero average, $V_{out}$ 22" must also have zero average. Therefore, the output voltage includes zero DC component while being limited between $V_h$ and $V_l$.

This ideal analysis applies only if the summing junction (inverting input) of integrator 512 remains at analog ground. To keep the summing junction at analog ground, integrator 512 preferably does not saturate. To guarantee this, resistors 318 and 316 are preferably scaled in the following manner to account for the maximum input from Vin 18. In a system application, stages preceding the clipper will limit at the power supply rails and give a predictable maximum signal swing. The voltage at the output of integrator 512 generally has a low-pass response with little peaking, and the dynamic range for steady state (DC) is close to the worst case. At steady state, the current developed by the output voltage of integrator 512, inverted by amplifier 514 and feeding through resistor 318, balances the current from Vin applied to resistor 316, because these are the only inputs that can provide steady state current to the summing junction of integrator 518. Resistors 316 and 318 should have a ratio that allows integrator 512 to stay within its own dynamic range under the maximum expected input swing from Vin, 18.

The active RC design of FIG. 4 may be conveniently realized in switched capacitor form as the biquad circuit shown in FIG. 5a. The switches shown in this figure, e.g., switches 912a and 912b, represent toggle-switches driven by a two-phase clock having even (e) and odd (o) phases. The switches connect the capacitors to one node or another as indicated by the letters "e" and "o." An actual circuit design would use MOSFET switches, which are well known in the art.

By analogy to the active RC version of FIG. 4a, switched capacitor 616 corresponds to resistor 316; switched capacitor 612 corresponds to DC feedback resistor 312; and switched capacitor 618, which is connected in inverting sense, corresponds to resistor 318 with signal inversion provided by resistors 314 and 414 and amplifier 514. It should be noted that these correspondences are for convenience in understanding the circuit topology; actual switched capacitor circuit design generally proceeds directly in the z-domain. The z-domain transfer function for the topology shown is:

$$H(z) = \frac{-DI(1 - z^{-1})}{DB + (AC + AE - 2DB)z^{-1} + (DB - AE)z^{-2}}$$

where:
A = Capacitor 618
B = Capacitor 718
C = Capacitor 612
D = Capacitor 712
E = Capacitor 620
I = Capacitor 616.

The actual DC voltage that appears at $V_{out}$ 22″ during circuit operation depends on the offset voltage of integrator 812. The DC component of $V_{out}$ settles to the input referred offset voltage of the integrator, taking into account offset inherent n the amplifier and offset from switched capacitor components. Depending on the system design requirements, the offset magnitude may be appreciable, relative to the clipping levels. Where very low offset voltage is required, an offset-cancelling auto-zeroed switched capacitor circuit, as shown in FIG. 5b, can be used to reduce the input referred offset of amplifier 812.

The biquad of FIG. 5b is similar to that of FIG. 5a except that during the even phase, switch 914 shorts out integrator 812 and causes capacitor 612 to store its offset. During the odd phase, capacitor 612 supplies the stored offset voltage, which cancels the offset of integrator 812 and allows it to accurately measure output voltage $V_{out}$ 22″.

Although the invention has been disclosed in connection with the particular embodiments described above, it is understood that the scope of the invention as claimed includes modifications and additional applications that will be apparent to those skilled in the art.

We claim:

1. A method for clipping an input signal to produce a clipped output signal that has zero average value and a high-pass frequency response, comprising the steps of:
   subtracting an error signal from the input signal to produce a modified input signal;
   clipping the modified input signal to produce the clipped output signal; and
   scaling and integrating the clipped output signal to produce the error signal.

2. The method of claim 1 in which the step of scaling and integrating the clipped output signal includes scaling by a predetermined gain constant to produce a predetermined high-pass time-constant that will pre-emphasize the clipped output signal over a predetermined frequency band.

3. The method of claim 2 including the step of low-pass filtering the modified input signal to produce a filtered input signal whereby the clipped output signal will be low-pass filtered above the predetermined frequency band over which it is pre-emphasized.

4. In a radio transmitter that processes a modulation signal to produce a modulated output, the improved modulation limiter to produce a clipped modulation signal having zero average value and a high-pass frequency response, comprising:
   means for subtracting an error signal from the modulation signal to produce a modified modulation signal;
   means for clipping the modified modulation signal to produce the clipped modulation signal; and
   means for scaling and integrating the clipped modulation signal to produce the error signal.

5. The improved modulation limiter of claim 4 in which the means for scaling and integrating the clipped modulation signal includes means for scaling by a predetermined gain constant to produce a predetermined time constant that will pre-emphasize the clipped modulation signal over a predetermined frequency band.

6. The improved modulation limiter of claim 5 including means for low-pass filtering the modified modulation signal to produce a filtered modulation signal whereby the clipped modulation signal will be low-pass filtered above the predetermined frequency band over which it is pre-emphasized.

7. An improved limiter for clipping an input signal to produce a clipped output signal that has zero average value and a high-pass frequency response, comprising:
   means for subtracting an error signal from the input signal to produce a modified input signal;
   means for clipping the modified input signal to produce the clipped output signal; and
   means for scaling and integrating the clipped output signal to produce the error signal.

8. The improved limiter of claim 7 in which the means for scaling and integrating the clipped output signal includes means for scaling by a predetermined gain constant to produce a predetermined time constant that will pre-emphasize the clipped output signal over a predetermined frequency band.

9. The improved limiter of claim 8 including means for low-pass filtering the modified input signal to produce a filtered input signal whereby the clipped output signal will be low-pass filtered above the predetermined frequency band over which it is pre-emphasized.

10. An improved limiter for clipping an input signal to produce a clipped output signal that has zero average value and pre-emphasis, comprising:
   means for scaling the input signal by an input gain constant to produce a scaled input signal;
   means for inverting and scaling an intermediate feedback signal by a feedback gain constant to produce a scaled negative feedback signal;
   means for summing the scaled input signal with the scaled negative feedback signal to produce a modified input signal;
   means for integrating the modified input signal to produce an intermediate output signal;
   means for clipping the intermediate output signal to produce the clipped output signal;
   means for scaling the intermediate output signal by a damping constant to produce a damping signal;
   means for scaling the clipped output signal by a predetermined gain constant to produce a scaled, clipped output signal; and
   integrator-summing means for integrating the scaled, clipped output signal and summing it with the damping signal to produce the intermediate feedback signal,
   whereby the clipped output signal has zero average value and a frequency response that pre-emphasizes the clipped output signal over a predetermined frequency band and low-pass filters it over a frequency band above the band over which it is pre-emphasized.

11. The improved limiter of claim 10 in which the integrator-summing means has limited dynamic range, the input signal has a predictable maximum input level, and the feedback and input gain constants have been selected in a ratio that will prevent the dynamic range of the integrator-summing means from being exceeded for any input signal level below the predictable maximum input level.

12. The improved limiter of claim 11 in which the means for integrating, scaling, inverting, and summing comprise operational amplifiers with resistor and capacitor input and feedback components.

13. The improved limiter of claim 11 in which the means for integrating, scaling, inverting, and summing comprise operational amplifiers with switched- and unswitched-capacitor input and feedback components.

14. The improved limiter of claim 13 including means for cancellation of amplifier offset.

* * * * *